(12) United States Patent
Park et al.

(10) Patent No.: US 12,144,213 B2
(45) Date of Patent: Nov. 12, 2024

(54) OLED DISPLAY DEVICE REDUCING LUMINANCE DIFFERENCE BETWEEN PIXEL ROW WHERE A HOLE IS DEFINED AND NOT DEFINED

(71) Applicant: Samsung Display Co., Ltd., Yongin-Si (KR)

(72) Inventors: Hyungjun Park, Seongnam-si (KR); Min Jeong Kim, Daejeon (KR); Jun-Yong An, Asan-si (KR); Nuree Um, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 54 days.

(21) Appl. No.: 17/315,612

(22) Filed: May 10, 2021

(65) Prior Publication Data

US 2022/0013618 A1 Jan. 13, 2022

(30) Foreign Application Priority Data

Jul. 8, 2020 (KR) .......................... 10-2020-0084039

(51) Int. Cl.
*G09G 3/3258* (2016.01)
*H10K 59/121* (2023.01)
*H10K 59/131* (2023.01)

(52) U.S. Cl.
CPC ......... *H10K 59/131* (2023.02); *G09G 3/3258* (2013.01); *H10K 59/1213* (2023.02)

(58) Field of Classification Search
CPC .......... G09G 3/30; G09G 3/32; G09G 3/3208; G09G 3/3216; G09G 3/3225; G09G 3/3241; G09G 3/325; G09G 3/3258; G09G 3/3266; G09G 3/3275
USPC ...................................................... 345/76–83
See application file for complete search history.

(56) References Cited

U.S. PATENT DOCUMENTS

| | | |
|---|---|---|
| 10,490,119 B2 | 11/2019 | Kim et al. |
| 10,879,330 B1* | 12/2020 | Cui ..................... H10K 59/128 |
| 2012/0169699 A1* | 7/2012 | Shin ...................... H01L 27/124 445/24 |
| 2014/0285542 A1* | 9/2014 | Izumi ................... G09G 3/3233 345/694 |
| 2014/0292622 A1* | 10/2014 | Lee ...................... H01L 27/3216 345/80 |

(Continued)

*Primary Examiner* — Ke Xiao
*Assistant Examiner* — Nelson Lam
(74) *Attorney, Agent, or Firm* — CANTOR COLBURN LLP

(57) ABSTRACT

A display device includes a substrate including a display area and a hole edge area defining a hole therein and surrounding the hole, where the display area surrounds the hole edge area, a plurality of pixels disposed in the display area in a first direction and a second direction intersecting the first direction, an emission control line extending in the first direction in the display area, and bypassing the hole along the hole edge area, a scan line extending in the first direction in the display area, located in the second direction from the emission control line, and bypassing the hole along the hole edge area, an active pattern disposed in the hole edge area, and overlapping the emission control line and the scan line in a plan view, and a connection line connected to the active pattern to provide a driving voltage to the active pattern.

20 Claims, 9 Drawing Sheets

(56) References Cited

U.S. PATENT DOCUMENTS

| | | | |
|---|---|---|---|
| 2015/0021561 A1* | 1/2015 | Jeon | H01L 29/786 |
| | | | 257/40 |
| 2015/0187260 A1* | 7/2015 | Lee | G09G 3/2003 |
| | | | 345/77 |
| 2017/0294502 A1* | 10/2017 | Ka | H10K 71/00 |
| 2020/0058728 A1* | 2/2020 | Song | H10K 59/131 |
| 2020/0098843 A1* | 3/2020 | Jeon | H10K 59/131 |
| 2020/0144352 A1* | 5/2020 | Lee | H10K 59/123 |
| 2020/0173949 A1* | 6/2020 | Lee | G01N 27/24 |
| 2020/0176542 A1* | 6/2020 | Park | H10K 59/131 |
| 2021/0233474 A1* | 7/2021 | Lee | H10K 59/131 |
| 2022/0216274 A1* | 7/2022 | An | G09G 3/3233 |
| 2022/0381957 A1* | 12/2022 | Ji | G09F 9/33 |

* cited by examiner

OLED DISPLAY DEVICE REDUCING LUMINANCE DIFFERENCE BETWEEN PIXEL ROW WHERE A HOLE IS DEFINED AND NOT DEFINED

This application claims priority to Korean Patent Application No. 10-2020-0084039 filed on Jul. 8, 2020, and all the benefits accruing therefrom under 35 U.S.C. § 119, the content of which in its entirety is herein incorporated by reference.

BACKGROUND

1. Field

Embodiments relates to a display device. More particularly, embodiments relate to a display device in which a hole is formed in a display area.

2. Description of the Related Art

A display device may include a display area for displaying an image and a non-display area located outside the display area. Pixels for displaying an image and wires connected to the pixels may be disposed in the display area. Drivers for driving the pixels and a functional module such as a camera module and a sensor module may be disposed in the non-display area.

In order to reduce a dead space caused by the non-display area, a hole may be defined in the display area. The functional module may be disposed on a rear surface of the display device to correspond to the hole, and the functional module may detect or recognize an object, a user, or the like located over a front surface of the display device through the hole. When the hole is defined in the display area, the wires disposed in the display area may bypass the hole.

SUMMARY

Since the pixels are not disposed in the hole, a pixel row in which the hole is defined and a pixel row in which the hole is not defined may have mutually different loads due to a difference in the number of pixels. Accordingly, a difference in luminance may occur between the pixel row in which the hole is defined and the pixel row in which the hole is not defined. When the difference in luminance occurs, the pixel row in which the hole is defined may be visually recognized as to be darker than the pixel row in which the hole is not defined.

Embodiments provide a display device in which a difference in luminance between a pixel row in which a hole is defined and a pixel row in which a hole is not defined is reduced.

A display device according to an embodiment includes: a substrate including a display area and a hole edge area, where the display area surrounds the hole edge area, and the hole edge area defines a hole therein and surrounds the hole; a plurality of pixels disposed in the display area in a first direction and a second direction intersecting the first direction; an emission control line extending in the first direction in the display area, and bypassing the hole along the hole edge area; a scan line extending in the first direction in the display area, located in the second direction apart from the emission control line, and bypassing the hole along the hole edge area; an active pattern disposed in the hole edge area, and overlapping the emission control line and the scan line in a plan view; and a connection line connected to the active pattern to provide a driving voltage to the active pattern.

In an embodiment, capacitors may be formed between the active pattern and the emission control line, and between the active pattern and the scan line, respectively.

In an embodiment, the connection line may be connected to a portion of the active pattern located between the emission control line and the scan line in the plan view.

In an embodiment, the connection line may extend in the first direction.

In an embodiment, the connection line may be connected to a pixel located in the first direction from the hole among the plurality of pixels.

In an embodiment, the connection line may be connected to a driving voltage line which extends in the second direction and provides the driving voltage to the pixel.

In an embodiment, the pixel may include: a switching transistor connected to the scan line; a driving transistor connected to the switching transistor, and through which a driving current flows, where the driving current corresponds to a data voltage provided to the switching transistor; and an emission control transistor connected to the driving transistor, and the emission control line may be connected to a gate electrode of the emission control transistor.

In an embodiment, the connection line may be disposed in the same layer as the active pattern.

In an embodiment, the active pattern may include a non-doped part that overlaps the emission control line and a doped part that does not overlap the emission control line in the plan view.

In an embodiment, the display device may further include a first insulating layer disposed on the active pattern and a second insulating layer disposed on the first insulating layer, the emission control line may be disposed between the first insulating layer and the second insulating layer, and the scan line may be disposed on the second insulating layer.

In an embodiment, in the hole edge area, a width of a portion of the scan line extending in the first direction may be greater than a width of a portion of the emission control line extending in the first direction, and the width of the portion of the scan line and the width of the portion of the emission control line may be measured in the second direction.

In an embodiment, the active pattern may define a recess part overlapping the emission control line in the plan view and recessed inward of the active pattern from an end of the active pattern.

In an embodiment, the active pattern may define an opening overlapping the emission control line in the plan view and provided inside the active pattern.

In an embodiment, the active pattern may include or be formed of polycrystalline silicon.

A display device according to an embodiment includes: a substrate including a display area and a hole edge area, where the display area surrounds the hole edge area, and the hole edge area defines a hole therein and surrounds the hole; a plurality of pixels disposed in the display area in a first direction and a second direction intersecting the first direction; a plurality of emission control lines extending in the first direction while being arranged in the second direction in the display area, and bypassing the hole along the hole edge area; a plurality of scan lines extending in the first direction while being alternately arranged with the emission control lines in the second direction in the display area, and bypassing the hole along the hole edge area; an active pattern disposed in the hole edge area, and overlapping the emission control lines and the scan lines in a plan view; and a plurality of connection lines connected to the active pattern to provide a driving voltage to the active pattern.

In an embodiment, the connection lines may be connected to portions of the active pattern that do not overlap the emission control lines and the scan lines, respectively in the plan view.

In an embodiment, the connection lines may be connected to pixels located in the first direction from the hole among the plurality of pixels, respectively.

A display device according to an embodiment includes: a substrate including a display area and a hole edge area, where the display area surrounds the hole edge area, and the hole edge area defines a hole therein and surrounds the hole; a plurality of pixels disposed in the display area in a first direction and a second direction intersecting the first direction; an active pattern disposed in the hole edge area; a plurality of first lines disposed on the active pattern, extending in the first direction while being arranged in the second direction in the display area, and bypassing the hole along the hole edge area; a plurality of second lines disposed on the first lines, extending in the first direction while being alternately arranged with the first lines in the second direction in the display area, and bypassing the hole along the hole edge area; and a plurality of connection lines connected to the active pattern to provide a driving voltage to the active pattern.

In an embodiment, each of the first lines may be an emission control line, and each of the second lines may be a scan line.

In an embodiment, the connection lines may be connected to portions of the active pattern that do not overlap the first lines and the second lines, respectively in a plan view.

In the display device according to the embodiments, the active pattern overlapping the emission control lines and the scan lines may be disposed in the hole edge area, and the connection line connected to the active pattern may provide the driving voltage to the active pattern, such that capacitors may be formed between the active pattern and the emission control lines and between the active pattern and the scan lines. Accordingly, a load of the pixel row in which the hole is defined may increase, and a difference in luminance between the pixel row in which a hole is defined and the pixel row in which a hole is not defined may decrease.

BRIEF DESCRIPTION OF THE DRAWINGS

Illustrative, non-limiting embodiments will be more clearly understood from the following detailed description taken in conjunction with the accompanying drawings.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Hereinafter, display devices in accordance with embodiments will be explained in detail with reference to the accompanying drawings.

Figure 1:
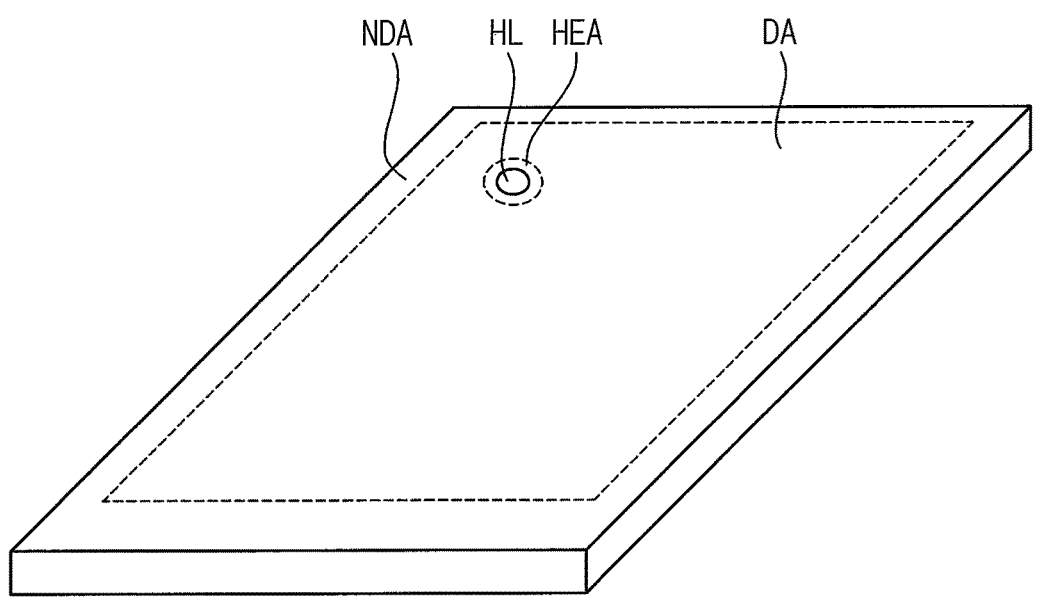
FIG. 1 is a perspective view showing a display device according to an embodiment of the present invention.

FIG. 1 is a perspective view showing a display device according to an embodiment of the present invention.

Referring to FIG. 1, a display device may include a display area DA for displaying an image a non-display area NDA in which an image is not displayed, and a hole edge area HEA surrounded by the display area DA. The non-display area NDA may be adjacent to the display area DA.

For example, the non-display area NDA may surround an outer periphery of the display area DA.

A hole HL may be defined in the hole edge area HEA. The hole HL may refer to an area from which a substrate (100 in FIG. 2) included in the display device is removed in the hole edge area HEA.

A functional module may be disposed on a rear surface of the display device to correspond to the hole HL. The functional module may receive external light passing through the hole HL, or may transmit a signal such as infrared rays and ultrasonic waves.

In an embodiment, the functional module may include: a camera module for capturing (or recognizing) an image of an object that is located over a front surface of the display device; a face recognition sensor module for detecting a face of a user; a pupil recognition sensor module for detecting a pupil of the user; an acceleration sensor module and a geomagnetic sensor module for determining a movement of the display device; a proximity sensor module and an infrared sensor module for detecting proximity with respect to the front surface of the display device; and an illuminance sensor module for measuring a degree of brightness of an outside.

The hole edge area HEA may surround the hole HL. The hole edge area HEA may be a non-display area.

In an embodiment, the hole HL may have a circular shape when viewed in a plan view, and the hole edge area HEA may have a circular ring shape when viewed in a plan view, but the present invention is not limited thereto. In another embodiment, the hole HL may have a polygonal shape, an elliptical shape, or the like when viewed in a plan view. Although FIG. 1 shows that one hole HL is defined in the display area DA, the present invention is not limited thereto, and a plurality of holes may be defined in the display area DA in another embodiment.

Figure 2:
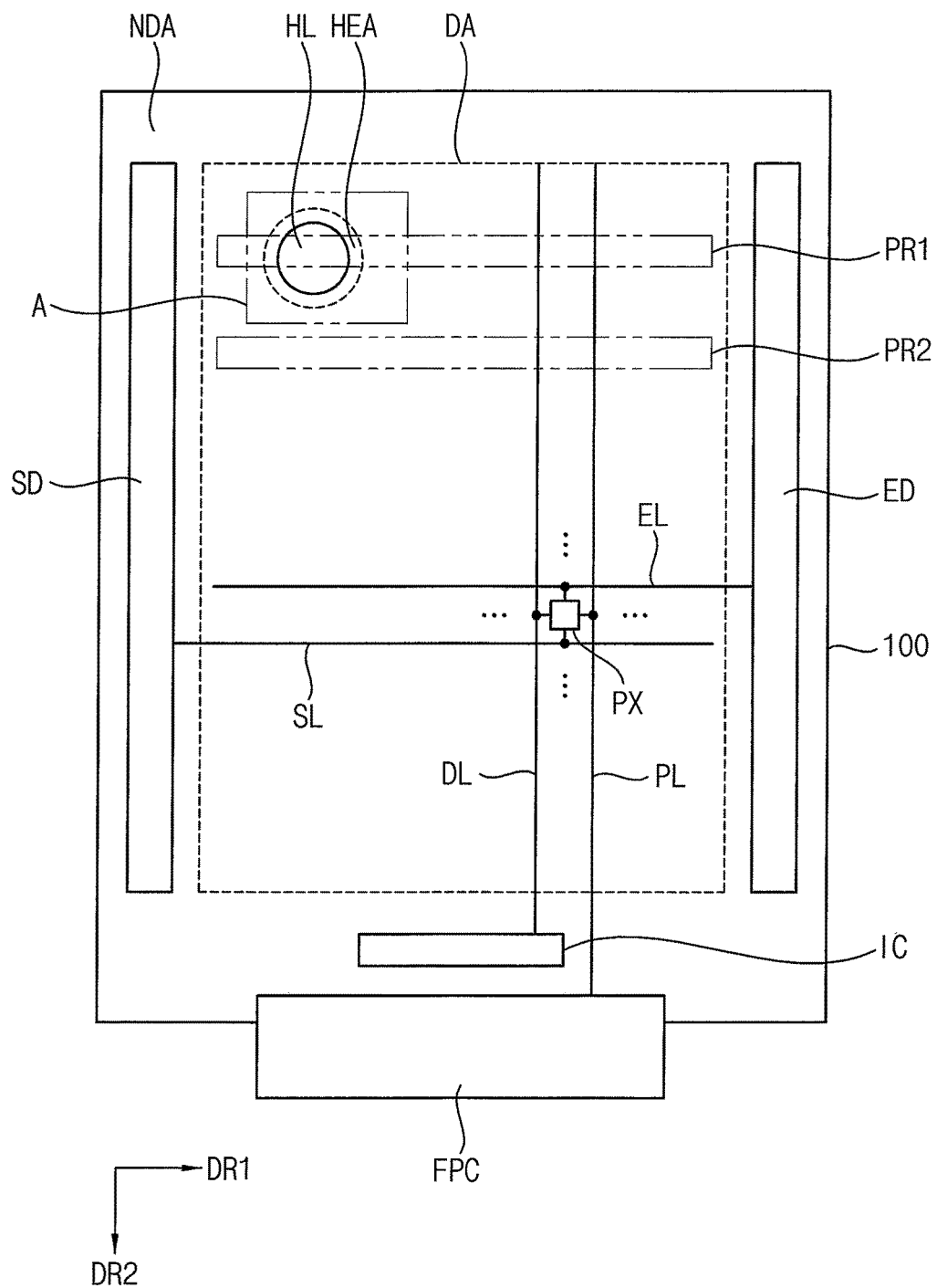
FIG. 2 is a plan view showing a display device according to an embodiment of the present invention.

FIG. 2 is a plan view showing the display device according to an embodiment of the present invention.

Referring to FIG. 2, the display device may include: a substrate 100; and pixels PX, a scan driver SD, an emission control driver ED, a driver chip IC, and a flexible printed circuit FPC that are disposed on the substrate 100.

The pixels PX may be disposed in the display area DA in a first direction DR1 and a second direction DR2 intersecting the first direction DR1. Accordingly, a plurality of pixel rows (e.g., PR1, PR2) extending in the first direction DR1 while being arranged in the second direction DR2, and a plurality of pixel columns extending in the second direction DR2 while being arranged in the first direction DR1 may be defined in the display area DA.

Each of the pixels PX may be connected to a scan line SL, an emission control line EL, a data line DL, and a driving voltage line PL. Scan lines SL may extend in the first direction DR1, and may provide scan signals to the pixels PX, respectively. Emission control lines EL may extend parallel to the scan lines SL, and may provide emission control signals to the pixels PX, respectively. Data lines DL may extend in the second direction DR2, and may provide data voltages to the pixels PX, respectively. Driving voltage lines PL may extend parallel to the data lines DL, and may provide driving voltages to the pixels PX, respectively. The display area DA may display an image through light emitted from each of the pixels PX.

The scan driver SD may be disposed in the non-display area NDA, and may be connected to the scan lines SL. The scan driver SD may provide the scan signals to the pixels PX through the scan lines SL, respectively.

The emission control driver ED may be disposed in the non-display area NDA, and may be connected to the emission control lines EL. The emission control driver ED may provide the emission control signals to the pixels PX through the emission control lines EL, respectively.

In an embodiment, the scan driver SD and the emission control driver ED may be disposed on both sides of the display area DA, respectively. However, the present invention is not limited thereto, and the scan driver SD and the emission control driver ED may be disposed on the same side of the display area DA in another embodiment.

The driver chip IC may be disposed in the non-display area NDA, and may be connected to the data lines DL. The driver chip IC may include a data driver configured to generate the data voltages. The data driver may provide the data voltages to the pixels PX through the data lines DL, respectively.

The flexible printed circuit FPC may be disposed in the non-display area NDA, and may be connected to the driving voltage lines PL. The flexible printed circuit FPC may be disposed on one side of the display area DA with the driver chip IC interposed between the flexible printed circuit FPC and the display area DA. The flexible printed circuit FPC may include a power supply configured to generate the driving voltages. The power supply may provide the driving voltages to the pixels PX through the driving voltage lines PL, respectively.

The pixels PX may not be disposed in the hole HL and in the hole edge area HEA on the substrate 100. Accordingly, the number of pixels PX included in a pixel row PR1 in which the hole HL is defined may be smaller than the number of pixels PX included in a pixel row PR2 in which the hole HL is not defined.

Scan lines SL disposed in the pixel row PR1 in which the hole HL is defined among the scan lines SL and emission control lines EL disposed in the pixel row PR1 in which the hole HL is defined among the emission control lines EL may bypass the hole HL along the hole edge area HEA. Data lines DL disposed in a pixel column in which the hole HL is defined among the data lines DL and driving voltage lines PL disposed in the pixel column in which the hole HL is defined among the driving voltage lines PL may bypass the hole HL along the hole edge area HEA.

Figure 3:
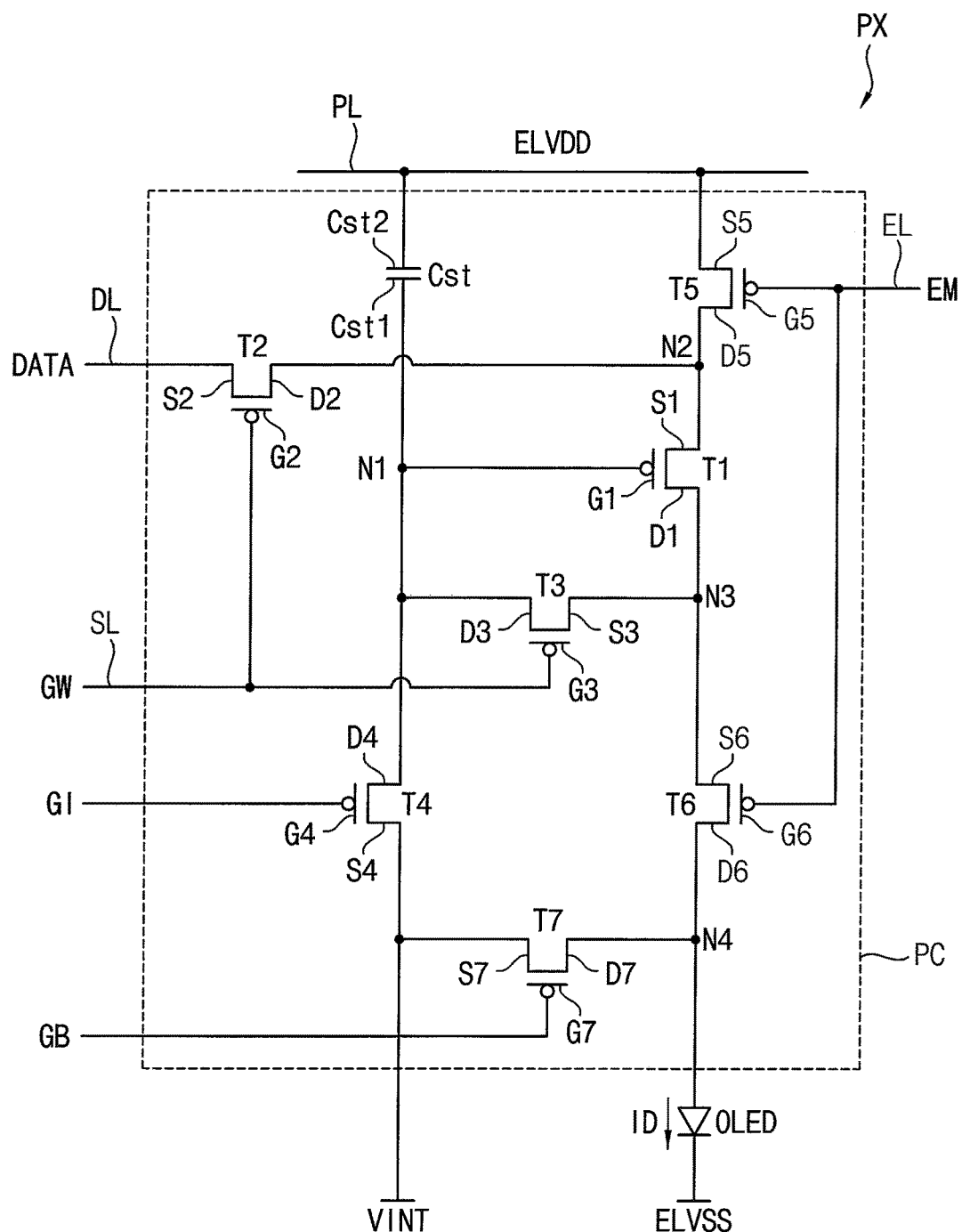
FIG. 3 is a circuit diagram showing a pixel of the display device of FIG. 2.

FIG. 3 is a circuit diagram showing a pixel PX of the display device of FIG. 2.

Referring to FIG. 3, the pixel PX may include a pixel circuit PC and a light emitting element OLED connected to the pixel circuit PC. The pixel circuit PC may include a driving transistor T1, a switching transistor T2, a compensation transistor T3, a first initialization transistor T4, a first emission control transistor T5, a second emission control transistor T6, a second initialization transistor T7, and a storage capacitor Cst.

The driving transistor T1 may include a first gate electrode G1 connected to a first node N1, a first source electrode S1 connected to a second node N2, and a first drain electrode D1 connected to a third node N3. The driving transistor T1 may receive a data voltage DATA according to a switching operation of the switching transistor T2 to supply a driving current ID to the light emitting element OLED.

The switching transistor T2 may include a second gate electrode G2 connected to the scan line SL to receive a scan signal GW, a second source electrode S2 connected to the data line DL to receive the data voltage DATA, and a second drain electrode D2 connected to the second node N2. The switching transistor T2 may be turned on according to the scan signal GW to perform the switching operation of transmitting the data voltage DATA to the first source electrode S1 of the driving transistor T1.

The compensation transistor T3 may include a third gate electrode G3 connected to the scan line SL to receive the scan signal GW, a third source electrode S3 connected to the third node N3, and a third drain electrode D3 connected to the first node N1. The compensation transistor T3 may be turned on according to the scan signal GW to electrically connect the first gate electrode G1 and the first drain electrode D1 of the driving transistor T1 to each other so as to diode-connect the driving transistor T1.

The first initialization transistor T4 may include a fourth gate electrode G4 configured to receive a previous scan signal GI, a fourth source electrode S4 configured to receive an initialization voltage VINT, and a fourth drain electrode D4 connected to the first node N1. The first initialization transistor T4 may be turned on according to the previous scan signal GI to supply the initialization voltage VINT to the first gate electrode G1 so as to perform an initialization operation of initializing the first gate electrode G1 of the driving transistor T1.

The first emission control transistor T5 may include a fifth gate electrode G5 connected to the emission control line EL to receive an emission control signal EM, a fifth source electrode S5 connected to the driving voltage line PL to receive a driving voltage ELVDD, and a fifth drain electrode D5 connected to the second node N2.

The second emission control transistor T6 may include a sixth gate electrode G6 connected to the emission control line EL to receive the emission control signal EM, a sixth source electrode S6 connected to the third node N3, and a sixth drain electrode D6 connected to a fourth node N4. The first emission control transistor T5 and the second emission control transistor T6 may be turned on according to the emission control signal EM to allow the driving voltage ELVDD to be supplied to the light emitting element OLED so as to allow the driving current ID to flow through the light emitting element OLED.

The second initialization transistor T7 may include a seventh gate electrode G7 configured to receive a bypass signal GB, a seventh source electrode S7 configured to receive the initialization voltage VINT, and a seventh drain electrode D7 connected to the fourth node N4. When the pixel PX is included in an $N^{th}$ pixel row, the bypass signal GB may be the same as a previous scan signal GI of an $(N+1)^{th}$ pixel row. The second initialization transistor T7 may be turned on according to the bypass signal GB to perform an initialization operation of initializing a first electrode of the light emitting element OLED.

The storage capacitor Cst may include a first capacitor electrode Cst1 connected to the first node N1, and a second capacitor electrode Cst2 connected to the driving voltage line PL to receive the driving voltage ELVDD.

The light emitting element OLED may include a first electrode connected to the fourth node N4, and a second electrode configured to receive a common voltage ELVSS. The light emitting element OLED may receive the driving current ID from the driving transistor T1 to emit light.

Although FIG. 3 shows that the pixel circuit PC according to an embodiment includes seven transistors and one capacitor, the present invention is not limited thereto. In another embodiment, the pixel circuit PC may include two to six transistors or eight or more transistors, and/or two or more capacitors.

Figure 4:
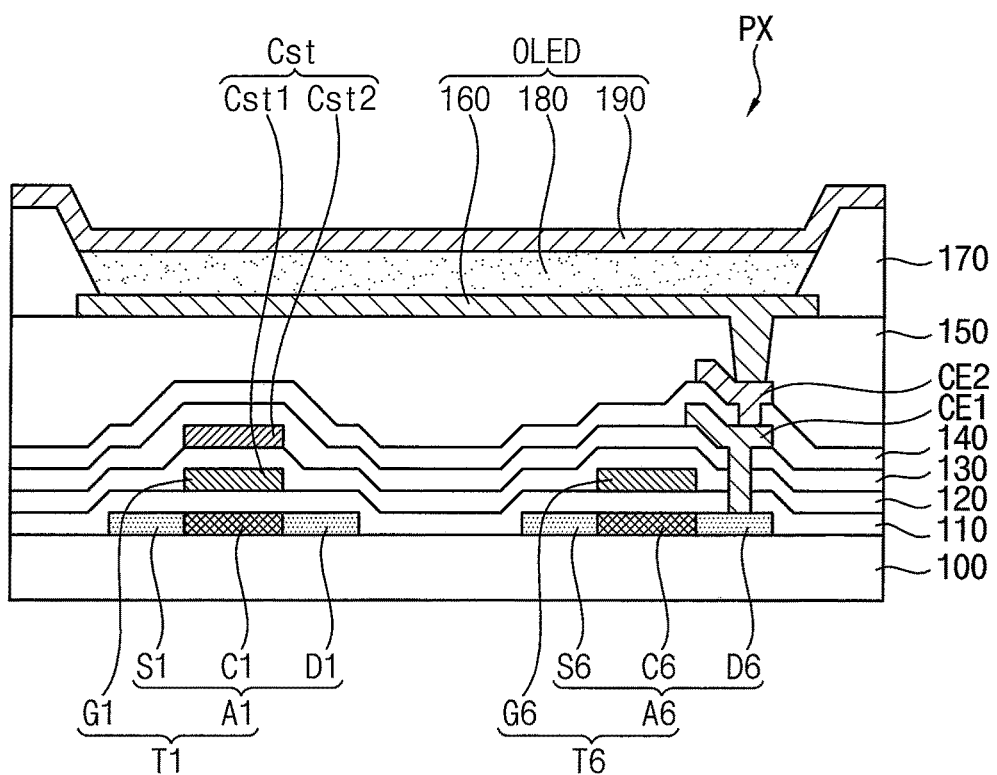
FIG. 4 is a sectional view showing the pixel of FIG. 3.

FIG. 4 is a sectional view showing the pixel PX of FIG. 3.

Referring to FIG. 4, the pixel PX may include: a substrate 100; and a driving transistor T1, a second emission control transistor T6, a storage capacitor Cst, and a light emitting element OLED that are disposed on the substrate 100. Although the switching transistor T2, the compensation transistor T3, the first initialization transistor T4, the first emission control transistor T5, and the second initialization transistor T7 of FIG. 3 are not shown in FIG. 4, a sectional structure of each of the switching transistor T2, the compensation transistor T3, the first initialization transistor T4, the first emission control transistor T5, and the second initialization transistor T7 may be substantially identical or similar to a sectional structure of each of the driving transistor T1 and the second emission control transistor T6.

The substrate 100 may be a transparent insulating substrate. For example, the substrate 100 may include or be formed of glass, quartz, plastic, or the like. In an embodiment, when the substrate 100 includes or is formed of the plastic, the substrate 100 may include a plurality of organic layers.

A first semiconductor pattern A1 and a sixth semiconductor pattern A6 may be disposed on the substrate 100. The first semiconductor pattern A1 and the sixth semiconductor pattern A6 may include or be formed of polycrystalline silicon.

The first semiconductor pattern A1 may include a first source electrode S1, a first drain electrode D1, and a first channel part C1 disposed between the first source electrode S1 and the first drain electrode D1. The first source electrode S1 and the first drain electrode D1 may be doped with P-type or N-type impurities, and the first channel part C1 may not be doped with impurities.

The sixth semiconductor pattern A6 may include a sixth source electrode S6, a sixth drain electrode D6, and a sixth channel part C6 disposed between the sixth source electrode S6 and the sixth drain electrode D6. The sixth source electrode S6 and the sixth drain electrode D6 may be doped with P-type or N-type impurities, and the sixth channel part C6 may not be doped with impurities.

A first insulating layer 110 may be disposed on the first semiconductor pattern A1 and the sixth semiconductor pattern A6. The first insulating layer 110 may include or be formed of an inorganic insulating material such as silicon nitride, silicon oxide, or silicon oxynitride.

The first gate electrode G1 and the sixth gate electrode G6 may be disposed on the first insulating layer 110. The first gate electrode G1 may overlap the first channel part C1, and the sixth gate electrode G6 may overlap the sixth channel part C6 in a plan view. The first gate electrode G1 and the sixth gate electrode G6 may include or be formed of a conductive material such as molybdenum (Mo), copper (Cu), aluminum (Al), or titanium (Ti).

The first source electrode S1, the first drain electrode D1, the sixth source electrode S6, and the sixth drain electrode D6 that are doped with impurities and the first channel part C1 and the sixth channel part C6 that are not doped with impurities may be formed by forming the first gate electrode G1 and the sixth gate electrode G6, and injecting impurities into the first semiconductor pattern A1 and the sixth semiconductor pattern A6 by using the first gate electrode G1 and the sixth gate electrode G6 as masks. The first semiconductor pattern A1 and the first gate electrode G1 may form the driving transistor T1, and the sixth semiconductor pattern A6, and the sixth gate electrode G6 may form the second emission control transistor T6.

A second insulating layer 120 may be disposed on the first gate electrode G1 and the sixth gate electrode G6. The second insulating layer 120 may include or be formed of an inorganic insulating material such as silicon nitride, silicon oxide, or silicon oxynitride.

The second capacitor electrode Cst2 may be disposed on the second insulating layer 120. The second capacitor electrode Cst2 may overlap the first gate electrode G1. In this case, the first gate electrode G1 may function as the first capacitor electrode Cst1. The second capacitor electrode Cst2 may include or be formed of a conductive material such as molybdenum (Mo), copper (Cu), aluminum (Al), or titanium (Ti). The first capacitor electrode Cst1 and the second capacitor electrode Cst2 with the second insulating layer 120 therebetween may form the storage capacitor Cst.

A third insulating layer 130 may be disposed on the second capacitor electrode Cst2. The third insulating layer 130 may include or be formed of an inorganic insulating material such as silicon nitride, silicon oxide, or silicon oxynitride.

A first connection electrode CE1 may be disposed on the third insulating layer 130. The first connection electrode CE1 may be connected to the sixth drain electrode D6. The first connection electrode CE1 may include or be formed of a conductive material such as molybdenum (Mo), copper (Cu), aluminum (Al), or titanium (Ti).

A fourth insulating layer 140 may be disposed on the first connection electrode CE1. The fourth insulating layer 140 may include or be formed of an inorganic insulating material such as silicon nitride, silicon oxide, or silicon oxynitride.

A second connection electrode CE2 may be disposed on the fourth insulating layer 140. The second connection electrode CE2 may be connected to the first connection electrode CE1. The second connection electrode CE2 may include or be formed of a conductive material such as molybdenum (Mo), copper (Cu), aluminum (Al), or titanium (Ti).

A fifth insulating layer 150 may be disposed on the second connection electrode CE2. The fifth insulating layer 150 may provide a flat upper surface over the driving transistor T1 and the second emission control transistor T6. The fifth insulating layer 150 may include or be formed of an organic insulating material such as polyimide ("PI").

A first electrode 160 may be disposed on the fifth insulating layer 150. The first electrode 160 may be connected to the second connection electrode CE2. The first electrode 160 may be electrically connected to the sixth drain electrode D6 through the first connection electrode CE1 and the second connection electrode CE2. The first electrode 160 may include or be formed of a conductive material such as a metal, an alloy, or transparent conductive oxide. For example, the conductive material may include silver (Ag), indium tin oxide ("ITO"), or the like.

A pixel defining layer 170 may be disposed on the first electrode 160. The pixel defining layer 170 may be disposed on the fifth insulating layer 150 to cover the first electrode 160. The pixel defining layer 170 may define a pixel opening that exposes at least a part of the first electrode 160. In an embodiment, the pixel opening may expose a central portion of the first electrode 160, and the pixel defining layer 170 may cover a peripheral portion of the first electrode 160. The pixel defining layer 170 may include or be formed of an organic insulating material such as polyimide (PI).

A light emitting layer 180 may be disposed on the first electrode 160. The light emitting layer 180 may be disposed on the first electrode 160 exposed by the pixel opening. The light emitting layer 180 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like, and the high molecular weight organic compound may include poly(3,4-ethylenedioxythiophene), polyaniline, poly-phenylenevinylene, polyfluorene, or the like.

In an embodiment, the quantum dot may include a core including a group II-VI compound, a group III-V compound, a group IV-VI compound, a group IV element, a group IV compound, or a combination thereof. In an embodiment, the quantum dot may have a core-shell structure including a core and a shell surrounding the core. The shell may serve as a protective layer for maintaining semiconductor characteristics by preventing chemical modification of the core, and serve as a charging layer for imparting electrophoretic characteristics to the quantum dot.

A second electrode 190 may be disposed on the light emitting layer 180. In an embodiment, the second electrode 190 may also be disposed on the pixel defining layer 170. The second electrode 190 may include or be formed of a conductive material such as a metal, an alloy, or transparent conductive oxide. For example, the conductive material may include aluminum (Al), platinum (Pt), silver (Ag), magnesium (Mg), gold (Au), chromium (Cr), tungsten (W), titanium (Ti), or the like. The first electrode 160, the light emitting layer 180, and the second electrode 190 may form the light emitting element OLED.

Figure 5:
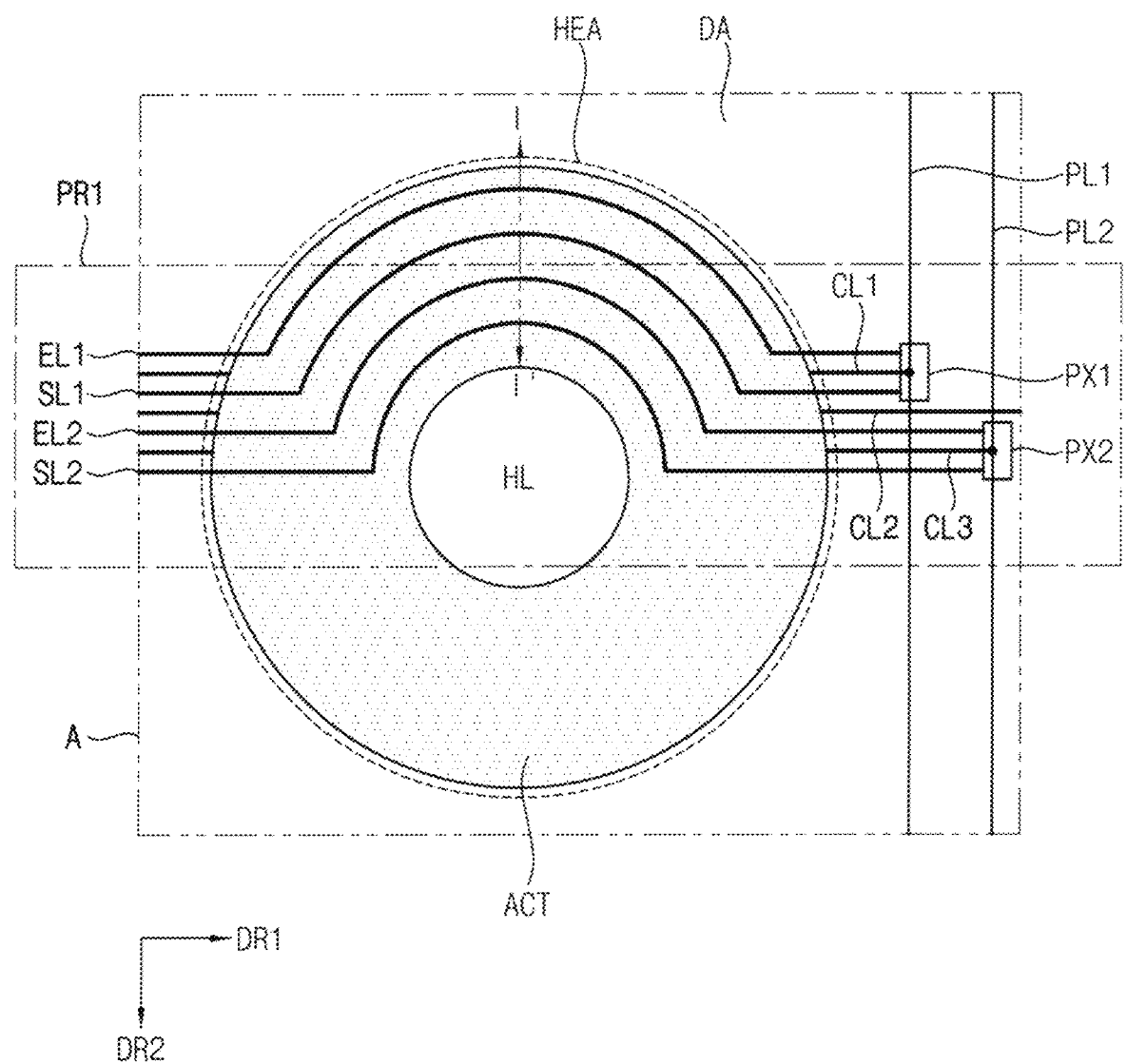
FIG. 5 is a plan view showing region A of FIG. 2.
Figure 6:
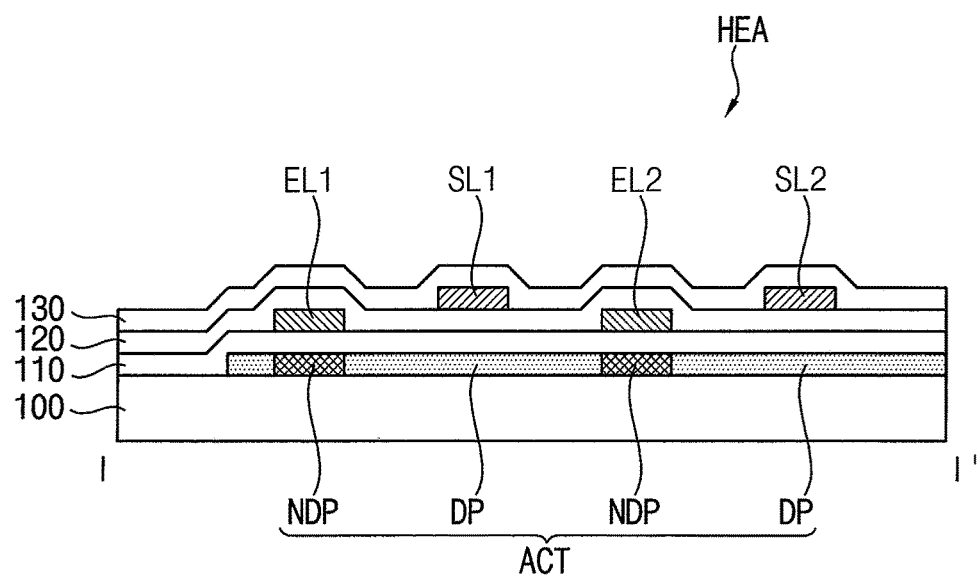
FIG. 6 is a sectional view taken along line I-I' of FIG. 5.

FIG. 5 is a plan view showing region A of FIG. 2. FIG. 6 is a sectional view taken along line I-I' of FIG. 5.

Referring to FIGS. 2, 5, and 6, the emission control lines EL and the scan lines SL may extend in the first direction DR1 while being alternately arranged with each other in the second direction DR2 in the display area DA. In an embodiment, a first scan line SL1 may be located in the second direction DR2 from a first emission control line EL1 a second emission control line EL2 may be located in the second direction DR2 from the first scan line SL1, and a second scan line SL2 may be located in the second direction DR2 from the second emission control line EL2. The emission control lines EL includes the first and second emission control lines EL1 and EL2, and the scan lines SL includes the first and second the scan lines SL1 and SL2.

The emission control lines EL1 and EL2 and the scan lines SL1 and SL2 disposed in the pixel row PR1 in which the hole HL is defined may bypass the hole HL along the hole edge area HEA. For example, the emission control lines EL1 and EL2 and the scan lines SL1 and SL2 may be bent or curved according to a shape of the hole edge area HEA without passing through the hole HL.

In an embodiment, in the hole edge area HEA, the emission control lines EL1 and EL2 may be disposed between the first insulating layer 110 and the second insulating layer 120, and the scan lines SL1 and SL2 may be disposed between the second insulating layer 120 and the third insulating layer 130. In this case, in the hole edge area HEA, the emission control lines EL1 and EL2 may be disposed in the same layer as the gate electrodes G1 and G6, and the scan lines SL1 and SL2 may be disposed in the same layer as the second capacitor electrode Cst2.

In an embodiment, in the display area DA, the emission control lines EL1 and EL2 and the scan lines SL1 and SL2 may be disposed between the first insulating layer 110 and the second insulating layer 120. In this case, first portions of the scan lines SL1 and SL2 in the display area DA and second portions of the scan lines SL1 and SL2 in the hole edge area HEA may be connected to each other through a contact part disposed at a boundary between the display area DA and the hole edge area HEA. For example, the contact part may be disposed on the third insulating layer 130, may be connected to the first portions of the scan lines SL1 and SL2 through a first contact hole defined through the second insulating layer 120 and the third insulating layer 130, and may be connected to the second portions of the scan lines SL1 and SL2 through a second contact hole defined through the third insulating layer 130.

As described above, since the number of the pixels PX included in the pixel row PR1 in which the hole HL is defined is smaller than the number of the pixels PX included in the pixel row PR2 in which the hole HL is not defined, a load of the emission control lines EL1 and EL2 and the scan lines SL1 and SL2 connected to the pixel row PR1 in which the hole HL is defined may be smaller than a load of the emission control lines EL and the scan lines SL connected to the pixel row PR2 in which the hole HL is not defined. In this case, since a signal delay of the emission control lines EL1 and EL2 and the scan lines SL1 and SL2 connected to the pixel row PR1 in which the hole HL is defined may be smaller than a signal delay of the emission control lines EL and the scan lines SL connected to the pixel row PR2 in which the hole HL is not defined, a difference in luminance may occur between the pixel row PR1 in which the hole HL is defined and the pixel row PR2 in which the hole HL is not defined. For example, even when a data voltage for the same gray scale is applied to the pixel row PR1 in which the hole HL is defined and the pixel row PR2 in which the hole HL is not defined, the pixel row PR1 in which the hole HL is defined may be visually recognized as to be darker than the pixel row PR2 in which the hole HL is not defined.

In order to reduce a difference between the load of the emission control lines EL1 and EL2 and the scan lines SL1 and SL2 connected to the pixel row PR1 in which the hole HL is defined and the load of the emission control lines EL and the scan lines SL connected to the pixel row PR2 in which the hole HL is not defined, an active pattern ACT overlapping the emission control lines EL1 and EL2 and the scan lines SL1 and SL2 in a plan view may be disposed in the hole edge area HEA. The active pattern ACT may be disposed between the substrate 100 and the first insulating layer 110. In this case, the active pattern ACT may be disposed in the same layer as the semiconductor patterns A1 and A6.

The active pattern ACT may include or be formed of substantially the same material as the semiconductor patterns A1 and A6. In an embodiment, the active pattern ACT may include or be formed of polycrystalline silicon.

A voltage may be provided to the active pattern ACT. In an embodiment, the driving voltage (ELVDD in FIG. 3) may be provided to the active pattern ACT. For example, the driving voltage ELVDD may be provided to portions of the active pattern ACT that are adjacent to the display area DA and the hole HL, respectively, but the present invention is not limited thereto. In another embodiment, the common voltage (ELVSS in FIG. 3) or the initialization voltage (VINT in FIG. 3) may be provided to the active pattern ACT.

Capacitors may be formed between the active pattern ACT and the emission control lines EL1 and EL2, and between the active pattern ACT and the scan lines SL1 and SL2, respectively. A first capacitor may be formed between the active pattern ACT and the emission control lines EL1 and EL2 with the first insulating layer 110 interposed therebetween, and a second capacitor may be formed between the active pattern ACT and the scan lines SL1 and SL2 with the first insulating layer 110 and the second insulating layer 120 interposed therebetween. In an embodiment, since the capacitors are formed between the active pattern ACT and the emission control lines EL1 and EL2 and between the active pattern ACT and the scan lines SL1 and SL2, respectively, the load of the emission control lines EL1 and EL2 and the scan lines SL1 and SL2 connected to the pixel row PR1 in which the hole HL is defined may be increased, such that the difference between the load of the emission control lines EL1 and EL2 and the scan lines SL1 and SL2 connected to the pixel row PR1 in which the hole HL is defined and the load of the emission control lines EL and the scan lines SL connected to the pixel row PR2 in which the hole HL is not defined may be effectively reduced.

As described above, the source electrodes S1 and S6 and the drain electrodes D1 and D6 that are doped with impurities and the channel parts C1 and C6 that are not doped with impurities may be formed by injecting impurities into the semiconductor patterns A1 and A6 by using the gate electrodes G1 and G6 as masks in a process of forming the semiconductor patterns A1 and A6. Similarly, doped parts DP that are doped with impurities and non-doped parts NDP that are not doped with impurities may be formed by injecting impurities into the active pattern ACT by using the emission control lines EL1 and EL2 as masks in a process of forming the active pattern ACT. In this case, the non-doped parts NDP may overlap the emission control lines EL1 and EL2, respectively, and the doped parts DP may not overlap the emission control lines EL1 and EL2 in a plan view.

When the driving voltage ELVDD is provided to the portions of the active pattern ACT that are adjacent to the display area DA and the hole HL, respectively, the non-doped parts NDP of the active pattern ACT having low electrical conductivity may block a current, such that the driving voltage ELVDD may not be applied to a doped part DP located between the non-doped parts NDP. In this case, the doped part DP located between the non-doped parts NDP may be electrically floated, such that a capacitor may not be formed between the doped part DP and the first scan line SL1 overlapping the doped part DP, where the doped part DP is located between the non-doped parts NDP.

In order to prevent at least a part of the active pattern ACT from being electrically floated, connection lines CL1, CL2, and CL3 connected to the active pattern ACT to provide the driving voltage ELVDD to the active pattern ACT may be provided in an embodiment. In an embodiment, the connection lines CL1, CL2, and CL3 may extend in the first direction DR1.

In an embodiment, the connection lines CL1, CL2, and CL3 may be disposed in the same layer as the active pattern ACT. In this case, the connection lines CL1, CL2, and CL3 may be disposed between the substrate 100 and the first insulating layer 110. The connection lines CL1, CL2, and CL3 may extend in the first direction DR1 from an end of the active pattern ACT.

In an embodiment, the connection lines CL1, CL2, and CL3 may be connected to portions of the active pattern ACT that do not overlap the emission control lines EL1 and EL2 and the scan lines SL1 and SL2, respectively. In other words, each of the connection lines CL1, CL2, and CL3 may be connected to a portion of the active pattern ACT located between the emission control lines EL1 and EL2 and the scan lines SL1 and SL2 when viewed in a plan view. For example, the first connection line CL1 may be connected to a portion of the active pattern ACT located between the first emission control line EL1 and the first scan line SL1 when viewed in a plan view, the second connection line CL2 may be connected to a portion of the active pattern ACT located between the first scan line SL1 and the second emission control line EL2 when viewed in a plan view, and the third connection line CL3 may be connected to a portion of the active pattern ACT located between the second emission control line EL2 and the second scan line SL2 when viewed in a plan view.

In an embodiment, the connection lines CL1, CL2, and CL3 may be connected to pixels PX located in the first direction DR1 from the hole HL, respectively. In other words, the connection lines CL1, CL2, and CL3 may be connected to the pixels PX (including first and second pixels PX1 and PX2) included in the pixel rows PR1 in which the hole HL is defined, respectively. For example, the first connection line CL1 may be connected to the first pixel PX1 located in the first direction DR1 from the hole HL, and the third connection line CL3 may be connected to the second pixel PX2, which is located in the first direction DR1 from the hole HL and located in the second direction DR2 from the first pixel PX1. The pixels PX include the first and second pixels PX1 and PX2.

The connection lines CL1, CL2, and CL3 may be connected to driving voltage lines PL extending in the second direction DR2 to provide the driving voltage ELVDD to the pixels PX located in the first direction DR1 from the hole HL, respectively. For example, the first connection line CL1 may be connected to a first driving voltage line PL1 configured to provide the driving voltage ELVDD to the first pixel PX1, and the third connection line CL3 may be connected to a second driving voltage line PL2 located in the first direction DR1 from the first driving voltage line PL1 to provide the driving voltage ELVDD to the second pixel PX2. The driving voltage line PL includes the first and second driving voltage lines PL1 and PL2.

In the display device according to the present embodiment, since the active pattern ACT overlapping the emission control lines EL1 and EL2 and the scan lines SL1 and SL2 in a plan view is formed in the hole edge area HEA, the capacitors may be formed between the active pattern ACT and the emission control lines EL1 and EL2, and between the active pattern ACT and the scan lines SL1 and SL2, respectively. In addition, since the connection lines CL1, CL2, and CL3 connected to the active pattern ACT provide the driving voltage ELVDD to the active pattern ACT, at least a part of the active pattern ACT may be prevented from being electrically floated. Accordingly, a load of the pixel row PR1 in which the hole HL is defined may be increased, and the difference in luminance between the pixel row PR1 in which the hole HL is defined and the pixel row PR2 in which the hole HL is not defined may be reduced.

Figure 7:
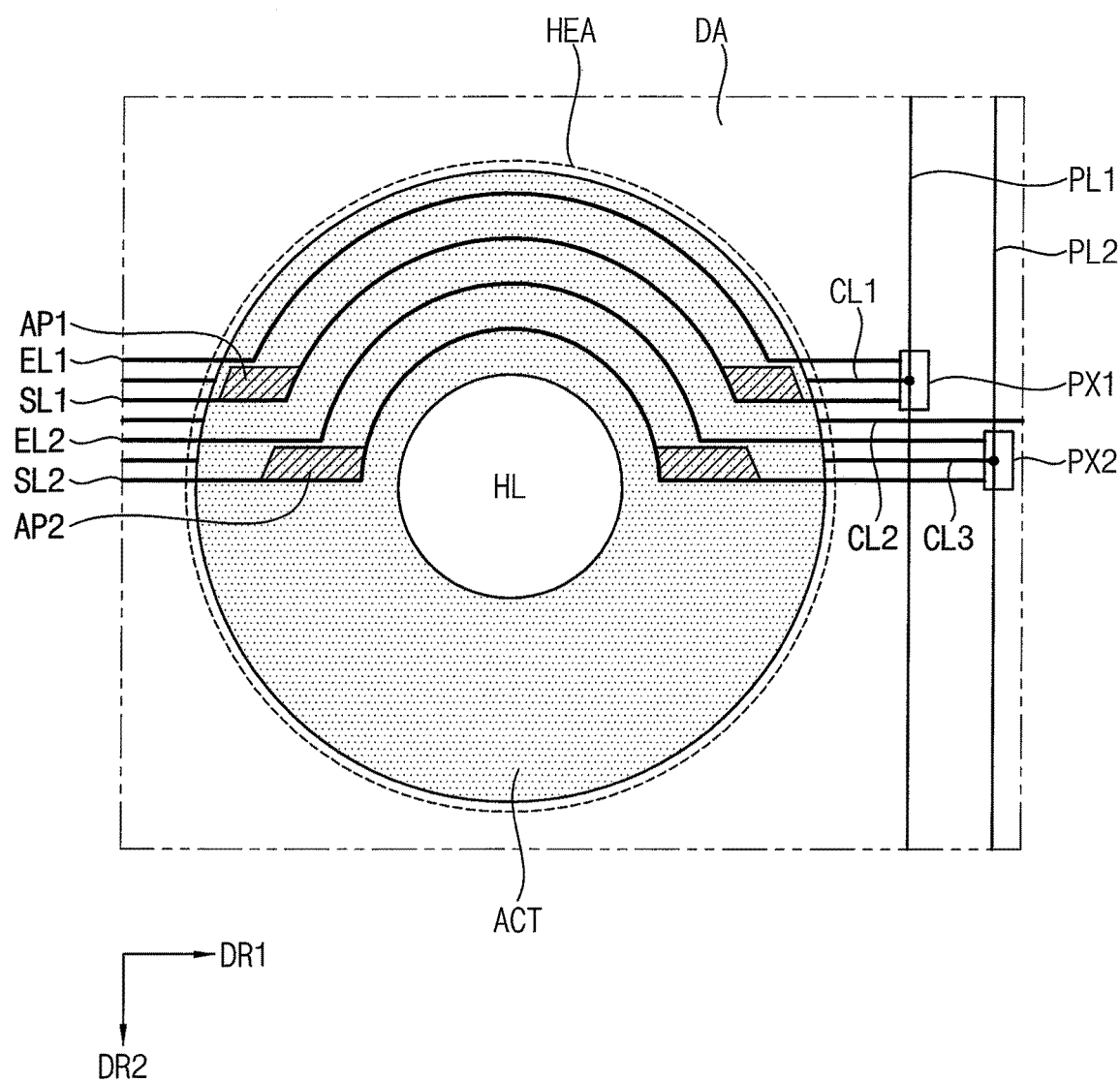
FIG. 7 is a plan view showing a periphery of a hole of a display device according to an embodiment of the present invention.

FIG. 7 is a plan view showing a periphery of a hole HL of a display device according to an embodiment of the present invention.

A display device that will be described with reference to FIG. 7 may be substantially identical or similar to the display device described with reference to FIGS. 1 to 6 except for the scan lines SL1 and SL2. Accordingly, descriptions of redundant components will be omitted.

Referring to FIG. 7, in an embodiment, in the hole edge area HEA, a width of a portion of each of the scan lines SL1 and SL2, which is measured in the second direction DR2, may be greater than a width of a portion of each of the emission control lines EL1 and EL2, which is measured in the second direction DR2.

A first additional pattern AP1 may be disposed at a portion of the first scan line SL1 extending in the first direction DR1 in the hole edge area HEA, and a second additional pattern AP2 may be disposed at a portion of the second scan line SL2 extending in the first direction DR1 in the hole edge area HEA. Each of a width of the first additional pattern AP1 in the second direction DR2 and a width of the second additional pattern AP2 in the second direction DR2 may be greater than a width of a portion of each of the emission control lines EL1 and EL2, which is measured in the second direction DR2.

As shown in FIG. 6, since the first insulating layer 110 is disposed between the active pattern ACT and the emission control lines EL1 and EL2, and the first insulating layer 110 and the second insulating layer 120 are disposed between the active pattern ACT and the scan lines SL1 and SL2, a capacitance of the second capacitor formed between the active pattern ACT and the scan lines SL1 and SL2 may be smaller than a capacitance of the first capacitor formed between the active pattern ACT and the emission control lines EL1 and EL2. However, since the additional patterns AP1 and AP2 are formed at the portions of the scan lines SL1 and SL2 extending in the first direction DR1 in the hole edge area HEA, respectively, an area of the scan lines SL1 and SL2 overlapping the active pattern ACT may be increased, such that the capacitance of the second capacitor may be increased in this embodiment. Therefore, a difference between the capacitance of the first capacitor and the capacitance of the second capacitor may be reduced.

Figure 8:
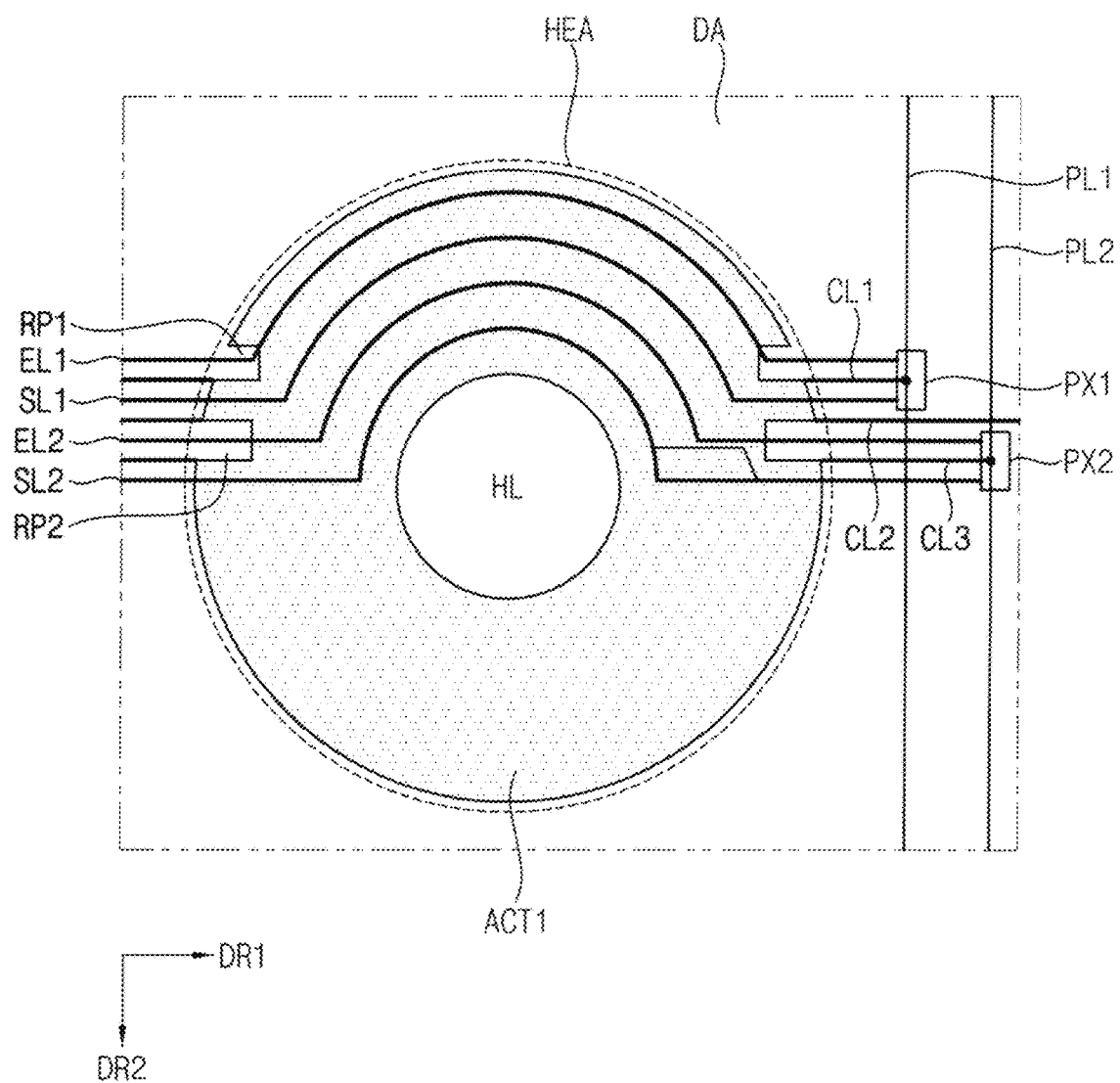
FIG. 8 is a plan view showing a periphery of a hole of a display device according to another embodiment of the present invention.

FIG. 8 is a plan view showing a periphery of a hole HL of a display device according to another embodiment of the present invention.

A display device that will be described with reference to FIG. 8 may be substantially identical or similar to the display device described with reference to FIGS. 1 to 6 except for the active pattern ACT1. Accordingly, descriptions of redundant components will be omitted.

Referring to FIG. 8, in an embodiment, the active pattern ACT1 may define recess parts RP1 and RP2 overlapping the emission control lines EL1 and EL2, respectively, in a plan view and recessed inward of the active pattern ACT1 from the end of the active pattern ACT1.

A first recess part RP1 may overlap the first emission control line EL1 in a plan view, and may be recessed inward of the active pattern ACT1 from the end of the active pattern ACT1 according to a shape of the first emission control line EL1. A second recess part RP2 may overlap the second emission control line EL2 in a plan view, and may be recessed inward of the active pattern ACT1 from the end of the active pattern ACT1 according to a shape of the second emission control line EL2.

As described above, the capacitance of the first capacitor formed between the active pattern ACT of FIG. 5 and the emission control lines EL1 and EL2 may be greater than the capacitance of the second capacitor formed between the active pattern ACT of FIG. 5 and the scan lines SL1 and SL2. However, since the recess parts RP1 and RP2 overlapping the emission control lines EL1 and EL2, respectively, in a plan view and recessed inward of the active pattern ACT from the end of the active pattern ACT are defined in the active pattern ACT1 in this embodiment, an area of the active pattern ACT overlapping the emission control lines EL1 and EL2 may be reduced compared to the embodiment of FIG. 5, such that the capacitance of the first capacitor may be reduced. Therefore, the difference between the capacitance of the first capacitor and the capacitance of the second capacitor may be reduced.

Figure 9:
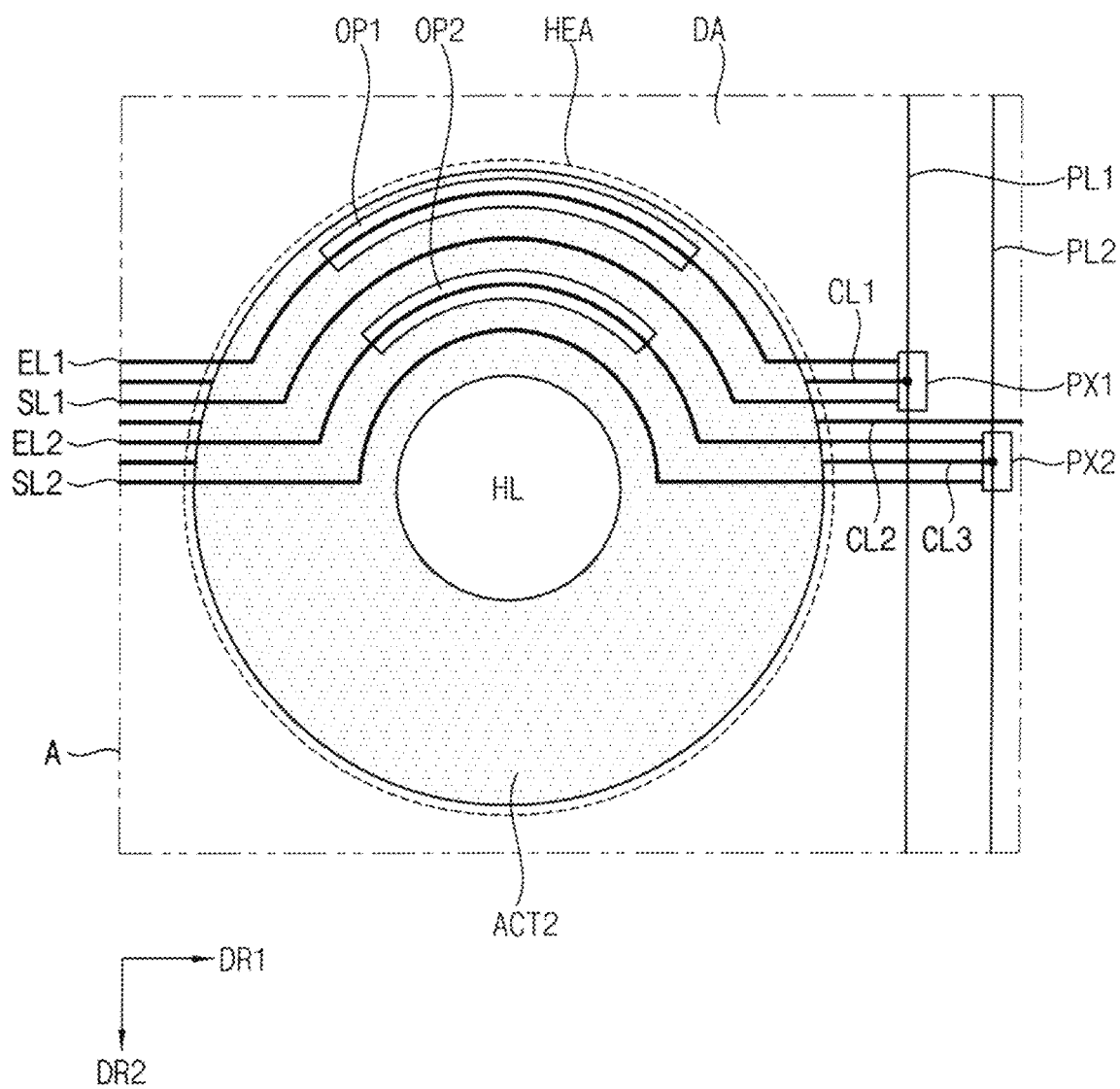
FIG. 9 is a plan view showing a periphery of a hole of a display device according to still another embodiment of the present invention.

FIG. 9 is a plan view showing a periphery of a hole HL of a display device according to another embodiment of the present invention.

A display device that will be described with reference to FIG. 9 may be substantially identical or similar to the display device described with reference to FIGS. 1 to 6 except for the active pattern ACT2. Accordingly, descriptions of redundant components will be omitted.

Referring to FIG. 9, in an embodiment, the active pattern ACT may define openings OP1 and OP2 overlapping the emission control lines EL1 and EL2, respectively and provided inside the active pattern ACT.

A first opening OP1 may overlap the first emission control line EL1 in a plan view, and may be defined inside the active pattern ACT according to the shape of the first emission control line EL1. A second opening OP2 may overlap the second emission control line EL2 in a plan view, and may be defined inside the active pattern ACT according to the shape of the second emission control line EL2.

As described above, the capacitance of the first capacitor formed between the active pattern ACT and the emission control lines EL1 and EL2 may be greater than the capacitance of the second capacitor formed between the active pattern ACT and the scan lines SL1 and SL2 in the embodiment of FIG. 5. However, since the openings OP1 and OP2 overlapping the emission control lines EL1 and EL2, respectively, and located inside the active pattern ACT are defined in the active pattern ACT in this embodiment of FIG. 9, the area of the active pattern ACT overlapping the emission control lines EL1 and EL2 may be reduced compared to the embodiment of FIG. 5, such that the capacitance of the first capacitor may be reduced. Therefore, the difference between the capacitance of the first capacitor and the capacitance of the second capacitor may be effectively reduced.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a substrate including a display area and a hole edge area, the display area surrounding the hole edge area, and the hole edge area defining a hole therein and surrounding the hole;
a plurality of pixels disposed in the display area in a first direction and a second direction intersecting the first direction;
an emission control line extending in the first direction in the display area, and bypassing the hole along the hole edge area;
a scan line extending in the first direction in the display area, located in the second direction apart from the emission control line, and bypassing the hole along the hole edge area;
an active pattern disposed in the hole edge area and not in the hole, overlapping the emission control line and the scan line in a plan view; and surrounding an entirety of the hole in the plan view; and
a connection line connected to the active pattern to provide a driving voltage to the active pattern,
wherein the hole is defined by an area in the hole edge area, and the area corresponds to removal of the substrate in the hole edge area defining a through-hole in the substrate, and
the active pattern is disposed between the substrate and the emission control line.

2. The display device of claim 1, wherein capacitors are formed between the active pattern and the emission control line, and between the active pattern and the scan line, respectively.

3. The display device of claim 1, wherein the connection line is connected to a portion of the active pattern located between the emission control line and the scan line in the plan view.

4. The display device of claim 1, wherein the connection line extends in the first direction.

5. The display device of claim 1, wherein the connection line is connected to a pixel located in the first direction from the hole among the plurality of pixels.

6. The display device of claim 5, wherein the connection line is connected to a driving voltage line which extends in the second direction and provides the driving voltage to the pixel.

7. The display device of claim 5, wherein the pixel includes:
a switching transistor connected to the scan line;
a driving transistor connected to the switching transistor, and through which a driving current flows, the driving current corresponding to a data voltage provided to the switching transistor; and
an emission control transistor connected to the driving transistor, and
the emission control line is connected to a gate electrode of the emission control transistor.

8. The display device of claim 1, wherein the connection line is disposed in a same layer as the active pattern.

9. The display device of claim 1, wherein the active pattern includes a non-doped part that overlaps the emission control line and a doped part that does not overlap the emission control line in the plan view.

10. The display device of claim 1, further comprising:
a first insulating layer disposed on the active pattern; and
a second insulating layer disposed on the first insulating layer,
wherein the emission control line is disposed between the first insulating layer and the second insulating layer, and
the scan line is disposed on the second insulating layer.

11. The display device of claim 10, wherein, in the hole edge area, a width of a portion of the scan line extending in the first direction is greater than a width of a portion of the emission control line extending in the first direction, and the width of the portion of the scan line and the width of the portion of the emission control line are measured in the second direction.

12. The display device of claim 10, wherein the active pattern defines a recess part overlapping the emission control line in the plan view and recessed inward of the active pattern from an end of the active pattern.

13. The display device of claim 10, wherein the active pattern defines an opening overlapping the emission control line in the plan view and provided inside the active pattern.

14. The display device of claim 1, wherein the active pattern includes or is formed of polycrystalline silicon.

15. A display device comprising:
a substrate including a display area and a hole edge area, the display area surrounding the hole edge area, and the hole edge area defining a hole therein and surrounding the hole;
a plurality of pixels disposed in the display area in a first direction and a second direction intersecting the first direction;
a plurality of emission control lines extending in the first direction while being arranged in the second direction in the display area, and bypassing the hole along the hole edge area;
a plurality of scan lines extending in the first direction while being alternately arranged with the emission control lines in the second direction in the display area, and bypassing the hole along the hole edge area;
an active pattern disposed in the hole edge area and not in the hole, overlapping the emission control lines and the scan lines in a plan view, and surrounding an entirety of the hole in the plan view; and
a plurality of connection lines connected to the active pattern to provide a driving voltage to the active pattern,
wherein the hole is defined by an area in the hole edge area, and the area corresponds to removal of the substrate in the hole edge area defining a through-hole in the substrate, and
the active pattern is disposed between the substrate and the emission control lines.

16. The display device of claim 15, wherein the connection lines are connected to portions of the active pattern that do not overlap the emission control lines and the scan lines, respectively in the plan view.

17. The display device of claim 15, wherein the connection lines are connected to pixels located in the first direction from the hole among the plurality of pixels, respectively.

18. A display device comprising:
a substrate including a display area and a hole edge area, the display area surrounding an entirety of the hole edge area, and the hole edge area defining a hole therein and surrounding the hole;
a plurality of pixels disposed in the display area in a first direction and a second direction intersecting the first direction;
an active pattern disposed in the hole edge area and not in the hole, and surrounding an entirety of the hole in the plan view;
a plurality of first lines disposed on the active pattern, extending in the first direction while being arranged in the second direction in the display area, and bypassing the hole along the hole edge area;
a plurality of second lines disposed on the first lines, extending in the first direction while being alternately arranged with the first lines in the second direction in the display area, and bypassing the hole along the hole edge area; and
a plurality of connection lines connected to the active pattern to provide a driving voltage to the active pattern,
wherein the hole is defined by an area in the hole edge area, and the area corresponds to removal of the substrate in the hole edge area defining a through-hole in the substrate, and
the active pattern is disposed between the substrate and the first lines.

19. The display device of claim 18, wherein each of the first lines is an emission control line, and
each of the second lines is a scan line.

20. The display device of claim 18, wherein the connection lines are connected to portions of the active pattern that do not overlap the first lines and the second lines, respectively in a plan view.

* * * * *